United States Patent [19]

Kawasaki et al.

[11] Patent Number: 5,326,979
[45] Date of Patent: Jul. 5, 1994

[54] ELECTRON BEAM LITHOGRAPHY SYSTEM

[75] Inventors: Katsuhiro Kawasaki, Katsuta; Takashi Matsuzaka, Iruma; Hiroya Ohta; Toshihiko Kohno, both of Kokubunji, all of Japan

[73] Assignee: Hitachi, Ltd., Tokyo, Japan

[21] Appl. No.: 950,689

[22] Filed: Sep. 25, 1992

[30] Foreign Application Priority Data

Sep. 25, 1991 [JP] Japan .................................. 3-243873

[51] Int. Cl.⁵ ............................................ H01J 37/256
[52] U.S. Cl. ................................. 250/492.2; 250/398
[58] Field of Search ................. 250/492.2, 492.22, 398

[56] References Cited

U.S. PATENT DOCUMENTS 4,947,413  8/1990  Jewell et al. ...................... 250/492.2
5,085,957  2/1992  Hosono ............................... 250/398
5,126,220  6/1992  Tokitomo et al. ............... 250/492.2

Primary Examiner—Paul M. Dzierzynski
Assistant Examiner—Kiet T. Nguyen
Attorney, Agent, or Firm—Antonelli, Terry, Stout & Kraus

[57] ABSTRACT

An electron beam lithography system which generates phase shift pattern data relating to main patterns, and exposes the phase shift pattern on a mask plate by using an electron beam in accordance with instruction from a computer. An electron beam lithography system is provided which can remarkably decrease a time needed for preparing phase shift pattern data. The apparatus is furnished with a parameter table for storing equations to generate phase shift pattern data, and generates the phase shift pattern data by assigning original pattern data into equations in accordance with a corresponding instruction for applying a phase shift method, and automatically exposes the phase shift pattern.

12 Claims, 2 Drawing Sheets

ELECTRON BEAM LITHOGRAPHY SYSTEM

BACKGROUND OF THE INVENTION

The present invention relates to an electron beam lithography system, and especially, to an apparatus preferable for exposing LSI (Large Scale Integrated Circuit) patterns.

Methods for exposing LSI patterns and phase shift patterns on a target mask plate by a phase shift method exist in the art. Patterns exposed by the phase shift method are, for example, a part of the wiring layers, VIA holes, and contact holes which are especially wanted to be more precisely exposed than other patterns in whole LSI layers, and the phase shift patterns are respectively arranged around the above described partial patterns. Accordingly, in order to make the following explanation clear, such a square or a rectangular pattern as the contact hole is taken as an example pattern which is exposed by the phase shift method, and is called a main pattern or an original pattern in contrast with the phase shift pattern. The following explanation can be naturally applicable to other patterns.

The LSI pattern data are put into the electron beam lithography system after being converted in format by the data converter, and are exposed on the mask plate. During the above described process, the original pattern is exposed at a designated position.

Next, phase shift pattern data which is converted in format by the data converter is transferred to the electron beam lithography system, and the phase shift patterns are exposed around the original pattern.

In the phase shift method, the original pattern is exposed precisely by interference of light passing through the phase shift patterns with light passing through the original pattern when a chip region of a LSI wafer is exposed using the mask plate.

Accordingly, in order to cause the above described interference of light certainly at a designated portion, the position and the shape of the respective phase shift patterns are precisely and definitely defined depending on shape of the corresponding original pattern.

But, in such a conventional technique as above described, there was a problem in that a long time was needed because the pattern design, format conversion by the data converter, and exposure by the electron beam lithography system were independently repeated to both the original pattern and the phase shift pattern. For example, in a case of 0.3 µm rule devices, about ten hours were required only for a format conversion of the phase shift pattern, and consequently, throughput was remarkably lowered.

SUMMARY OF THE INVENTION

The object of the present invention is to provide an electron beam lithography systems which can effectively depict phase shift patterns.

In accordance with the present invention, an electron beam lithography system having a means for generating an electron beam, a means for forming a predetermined pattern on a target by scanning the electron beam on the target, and a means for generating a phase shift pattern relating to the predetermined pattern is provided.

Other objects and feature of the present invention will become apparent from the following description of embodiments with reference to the accompanying drawings.

DETAILED DESCRIPTION OF THE PREFERRED EMBODIMENTS

Figure 1:
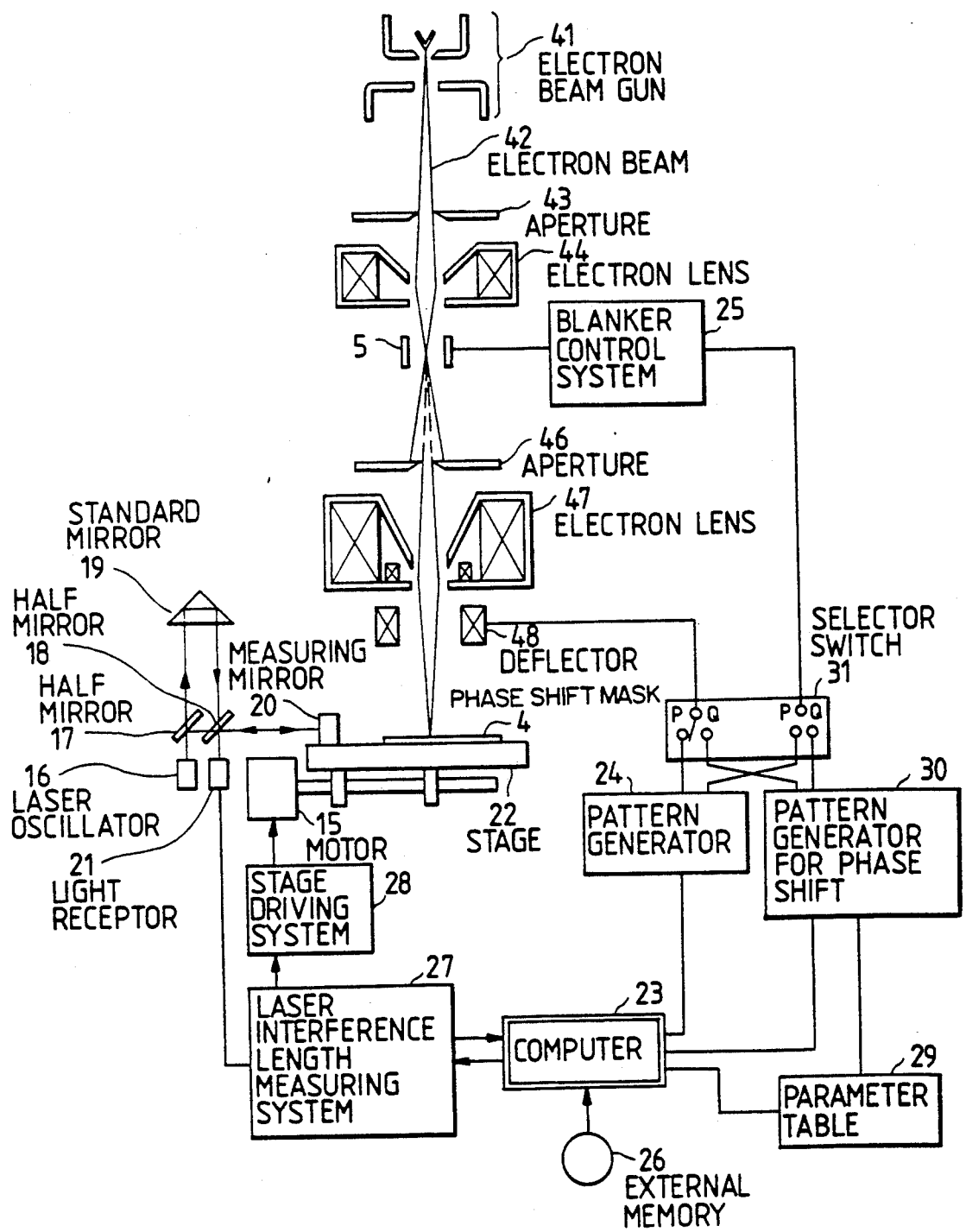
FIG. 1 is a schematic partial block diagram illustrating an embodiment of the electron beam lithography system relating to the present invention.

Referring to FIG. 1, the electron beam 42 released from the electron beam gun 41 is controlled by the electron lenses 44, 47 and the apertures 43, 46 etc. to an electron beam having a predetermined shape and current density, and is irradiated on a target, i.e., the mask plate or, more specifically, the phase shift mask plate 4.

Data for exposing patterns are generally stored in the external memory 26 such as a magnetic disk. In exposing predetermined patterns, the patterns are read out by the computer 23, and successively transmitted to the pattern generating apparatus 24. The pattern generating apparatus 24 transmits signals on deflecting positions to the deflector 48, and exposes predetermined patterns on the phase shift mask plate 4 by sending out on-off signals of electron beam 42 to the blanker control system 25.

In consideration of aberration and deflective distortion caused by deflection of the electron beam, it is impossible to deflect to a whole surface of the mask plate 4 by the electron beam 42 while holding the mask plate at a single location. Accordingly, a region having a few millimeters width is covered by the deflection at each mask positioning, and then a subsequently next region of a few millimeters wide is covered by moving the stage 22, and the pattern is made to be exposed by precise determination of the deflective position on a whole plane of the mask plate 4 by repeating the above described operations.

The deflective position of the respective region is determined by precise measurement of the position of the stage 22 with a laser interference length measuring system. A laser beam from the laser oscillator 16 in a laser interferometer is divided into a standard light and a measuring light by the half mirror 17, and the measuring light is projected to the measuring mirror 20 and causes interference with the standard light which is projected to the standard mirror 19 through the half mirror 18.

At the light receptor 21, lightness of the interference wave are converted to pulses, and the laser interference length measuring system 27 recognizes the pulses as data on positions and puts the data into the computer 23.

Next, a control method for moving the stage 22 is explained. When the laser interference length measuring system 27 sends information on a target position of the stage 22 to the stage driving system 28, the motor 15 starts driving and transfers the stage 22 to the target position. The computer 23 reads out a stopping error from the laser interference length measuring system 27, and sends corrective data on deflective positions corresponding to an amount of the stopping error to the pattern generating apparatus 24 or the pattern generator for phase shift apparatus 39 for correcting the deflective position. By repeating the above described beam deflection and stage moving, the pattern is exposed on whole plane of the mask plate 4.

In a case when exposing a etc., predetermined pattern to make a conventional mask which are not applied by the phase shift method, the deflector 48 and the blanker control system 25, etc., are driven by data from the pattern generating apparatus 24.

In a case when exposing the phase shift pattern, the computer 23 generates an instruction for applying the phase shift method, and sends predetermined patterns to the pattern generator for the phase shift pattern generating apparatus 30. Then, the apparatus 30 creates a phase shift pattern, generates signals for the phase shift pattern, and sends signals to the deflector 48 and the blanker control system 25 by the instruction. Accordingly, the selector switch 31 is turned to a P side when exposing the main pattern (that is the original pattern) on the phase shift mask 4, and is changed to a Q side when exposing the phase shift patterns on the phase shift mask 4.

Further, the LSI pattern data which are converted in format and stored in the external memory 26 such as magnetic disks are transferred to the computer 23, and parameters in exposing the phase shift pattern data are settled in the parameter table 29.

The phase shift pattern generating apparatus 30 generates data on the phase shift patterns from the data on the predetermined patterns and the parameters in the corresponding phase shift patterns stored in the parameter table 29.

Figure 2:
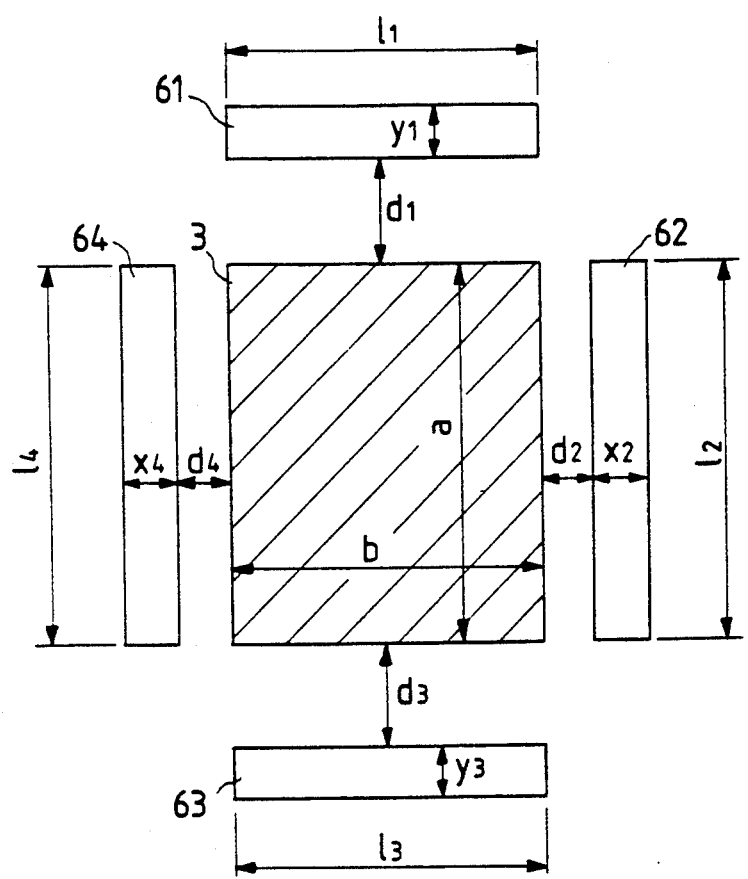
FIG. 2 is an example of the original patterns and the relating phase shift patterns to be exposed by the electron beam lithography system shown in FIG. 1.

Next, an example of content of data calculation which is performed by the phase shift pattern generating apparatus 30 on the phase shift patterns is explained by referring to FIG. 2.

In FIG. 2, preciseness of a contour (four sides) of the original pattern 3 is determined by distance d, width x or y, and length l, etc., of respective corresponding phase shift patterns 61, 62, 63 and 64, and the preciseness is related to the data of the original pattern 3.

For instance, the distance $d_1$, the width $y_1$, and the length $l_1$, etc., of the phase shift pattern 61 are defined by the following equations:

$$d_1 = f_1(a,b),\ y_1 = f_2(a,b),\ l_1 = f_3(a,b) \quad (1)$$

The above described a and b are data (lengths of two sides) on the original pattern 3, and the above described functions such as $f_1$, $f_2$, and $f_3$ are stored and settled in the parameter table 29 as parameters for phase shift pattern data. Further, other values such as $d_2$, $x_2$, and $l_2$, etc., are also stored and settled in the parameter table 29 as well.

In accordance with an embodiment of the present invention, when exposing a whole pattern of an LSI on the mask plate 4, corresponding phase shift pattern data can be instantaneously calculated by assignment of data on the original pattern to the functions stored and settled in the parameter table 29 at every generation of data on a portion (an original pattern) which must be applied to the phase shift method. Accordingly, the phase shift pattern on wiring layers and on portions which appear frequently and have delicate shapes such as VIA holes and contact holes can be exposed remarkably fast.

That means, because designing of phase shift patterns at each cases for format conversion is not necessary and typical data for phase shift pattern becomes unnecessary, a large amount of data on exposing patterns can be decreased and a throughput of the electron beam lithography system can be remarkably increased.

As many modifications and changes which may be made without departing from the spirit and scope of the present invention will be advantageous to those skilled in the art, it is to be understood that the present invention is not limited to the specific embodiments as above described.

What is claimed is;

1. An electron beam lithography system comprising:
a means for generating an electron beam,
a means for forming a predetermined pattern on a target by scanning of said electron beam on the target, and
a means for generating a phase shift pattern relating to said predetermined pattern.

2. An electron beam lithography system comprising:
a means for generating an electron beam,
a means for forming a predetermined main pattern on a target by scanning of said electron beam on the target, and
a means for generating a phase shift pattern relating to said main pattern, wherein
said means for generating said phase shift pattern includes a means for obtaining data which feature said phase shift pattern by calculation based on said main pattern.

3. An electron beam lithography system as claimed in claim 2, wherein
said data which feature said phase shift pattern include a position data and a shape data of said phase shift pattern.

4. An electron beam lithography system as claimed in claim 3, wherein:
said means for generating said phase shift pattern includes a means for storing equations to calculate the position and the shape of the phase shift pattern, and
said means for storing said equations which feature the phase shift pattern calculating the position and the shape of the phase shift pattern by assigning the data of the main pattern into said equations.

5. An electron beam lithography system as claimed in claim 2, which further comprises:
a means for generating data of said main pattern, and
a means for selecting any one of said means for generating said data of the main pattern and said means for generating said phase shift pattern in order to form any one of said main pattern and said phase shift pattern on said target.

6. An electron beam lithography system comprising:
a means for generating an electron beam,
a means for irradiating a target with said electron beam,
a means for deflecting said electron beam so as to scan said target with said electron beam to form a main pattern,
a means for controlling said irradiation and said deflection of said electron beam,
a means for generating data of said main pattern,
a means for generating data of said phase shift pattern relating to said data of said main pattern, and
a means for selectively connecting either said means for generating data of said main pattern or said means for generating data of said phase shift pattern to said means for controlling so as to selectively form either a means for generating phase shift pattern relating to said main pattern,
said main pattern or said phase shift pattern on said target.

7. An electron beam lithography system as claimed in claim 6, wherein said means for generating said data of said phase shift pattern further comprises:

a means for obtaining data of a position and a shape of said phase shift pattern, and a means for storing equations to calculate said data of said position and said shape of said phase shift pattern by assigning said data obtained from said main pattern into said equations.

8. An electron beam lithography system for exposing LSI main patterns on a phase shift mask plate by scanning an electron beam comprising:

a means for generating pattern data from said LSI main patterns scanned by said electron beam, a means for generating a phase shift instruction, and a means for generating a phase shift pattern by using said pattern data from said main patterns in accordance with said instruction.

9. An electron beam lithography system as claimed in claim 8, wherein said means for generating said phase shift pattern is furnished with a means for obtaining data of a position and a shape of corresponding to said phase shift pattern by using said pattern data from said main patterns.

10. An electron beam lithography system as claimed in claim 9, wherein:

said means for generating said phase shift pattern is furnished with a means for storing equations for calculating said position and said shape data of said phase shift patterns, and for calculating said data of said position and said shape of corresponding to said phase shift patterns by assigning said pattern data obtained from said main patterns into said equations.

11. An electron beam lithography system as claimed in claim 10, wherein:

said phase shift patterns are contact holes and VIA holes.

12. An electron beam lithography system as claimed in claim 10, wherein:

said means for generating said data from said LSI main patterns and said means for generating said phase shift pattern are furnished separately, and a means for selectively switching a connection of an output of said means for generating said data from said LSI main patterns and an output of said means for generating said phase shift pattern to form said LSI main patterns or said phase shift pattern.

* * * * *